(12) United States Patent
Shinjo et al.

(10) Patent No.: US 6,951,800 B2
(45) Date of Patent: Oct. 4, 2005

(54) METHOD OF MAKING SEMICONDUCTOR DEVICE THAT HAS IMPROVED STRUCTURAL STRENGTH

(75) Inventors: Yoshiaki Shinjo, Kawasaki (JP); Yuzo Shimobeppu, Kawasaki (JP); Kazuo Teshirogi, Kawasaki (JP); Kazuhiro Yoshimoto, Kawasaki (JP); Eiji Yoshida, Kawasaki (JP); Noboru Hayasaka, Kawasaki (JP); Mitsuhisa Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/101,174

(22) Filed: Mar. 20, 2002

(65) Prior Publication Data

US 2003/0077880 A1 Apr. 24, 2003

(30) Foreign Application Priority Data

Oct. 19, 2001 (JP) ........................................ 2001-322812

(51) Int. Cl.⁷ .................. H01L 21/301; H01L 21/46; H01L 21/78
(52) U.S. Cl. ..................... 438/462; 438/33; 438/113
(58) Field of Search ..................... 438/33, 113, 460, 438/462

(56) References Cited

U.S. PATENT DOCUMENTS

| | | | |
|---|---|---|---|
| 4,390,392 A | 6/1983 | Robinson et al. | ........... 156/643 |
| 5,693,182 A | 12/1997 | Mathuni | |
| 6,046,504 A | * 4/2000 | Kimura | ........... 257/775 |
| 6,261,919 B1 | * 7/2001 | Omizo | ........... 438/401 |
| 6,337,257 B1 | 1/2002 | Toyosawa | ........... 438/459 |
| 6,451,671 B1 | * 9/2002 | Yamada | ........... 438/460 |
| 2001/0055856 A1 | * 12/2001 | Tao | |

FOREIGN PATENT DOCUMENTS

| | | |
|---|---|---|
| EP | 1 091 394 A | 4/2001 |
| EP | 1 098 365 A | 5/2001 |
| JP | 62-275788 | 11/1987 |
| JP | 1-138723 | 5/1989 |
| JP | 4-42972 | 2/1992 |
| JP | 5-208406 | 8/1993 |
| JP | 5-72359 U | 10/1993 |
| JP | 07-78793 | 3/1995 |
| JP | 7-78793 | 3/1995 |
| JP | 8-115893 | 5/1996 |
| JP | 09-38852 | 2/1997 |
| JP | 11-67700 | 3/1999 |
| JP | 2000-124176 | 4/2000 |
| JP | 2000-299354 | 10/2000 |
| JP | 2001-176830 | 6/2001 |

* cited by examiner

*Primary Examiner*—George Fourson
*Assistant Examiner*—Fernando L. Toledo
(74) *Attorney, Agent, or Firm*—Westerman, Hattori, Daniels & Adrian, LLP

(57) ABSTRACT

A method of making a semiconductor device includes a back-grinding step of grinding a back surface of a semiconductor substrate, a dicing step of dicing the semiconductor substrate along predetermined dicing lines so as to make pieces of semiconductor devices after the back-grinding step, and a laser exposure step of shining laser light on the back surface of the semiconductor substrate after the back-grinding step so as to remove grinding marks generated by the back-grinding step.

1 Claim, 25 Drawing Sheets

METHOD OF MAKING SEMICONDUCTOR DEVICE THAT HAS IMPROVED STRUCTURAL STRENGTH

BACKGROUND OF THE INVENTION

1. Field of the Invention

The present invention generally relates to methods of manufacturing semiconductor devices, and particularly relates to a method of manufacturing semiconductor devices which applies back-grinding to the back surfaces at the back-grinding stage.

2. Description of the Related Art

In recent years, portable terminals such as portable phones have been experiencing a rapid change of shapes towards increasingly compact and flat terminals. To this end, semiconductor devices used in such electronic equipment are expected to be flatter than ever.

In order to provide a flatter shape for semiconductor devices, the back surface of wafers are ground after circuitry is formed on the wafers. When the semiconductor devices are given a flatter shape through such a process, the structural strength will deteriorate.

Accordingly, there is a need to prevent chipping or cracking of semiconductor devices during the manufacturing process when a flatten shape is given to the devices.

FIGS. 1A through 1E are drawings showing an example of process steps concerning a related-art method of manufacturing a semiconductor device. FIGS. 1A and 1B show back-grinding steps that are performed after a wafer process in which circuits are formed on a wafer 1. FIGS. 1C and 1D show dicing steps, and FIG. 1E illustrates a mounting step.

As shown in FIG. 1A, the wafer 1 for which the wafer process is completed has a surface protection tape 2 adhered thereto. The surface of the wafer 1 on which the circuits are formed faces the surface protection tape 2. With this provision, the circuits formed on the wafer 1 are protected by the surface protection tape 2.

The wafer 1 having the surface protection tape 2 stuck thereon is mounted on a wafer chuck table 3 of a back-grinding apparatus. The back-grinding apparatus has a grinding head 4 that revolves. As shown in FIG. 1B, the back surface of the wafer 1 is rubbed against the grinding head 4, which achieves back-grinding of the back surface of the wafer 1 (i.e., back-grinding step).

When the wafer 1 is ground so as to have a predetermined thickness through the back-grinding step, as shown in FIG. 1C, the surface protection tape 2 is taken off from the wafer 1, and the back surface of the wafer 1 is stuck to a dicing tape 6. The dicing tape 6 is provided inside a frame 5, and has a surface thereof to which an adhesive (e.g., an adhesive that cures upon exposure to ultraviolet light) is applied so as to have the wafer 1 adhere thereto.

The wafer 1 stuck on the dicing tape 6 is carried to a dicing apparatus, where dicing is performed (i.e., a dicing step). The dicing is performed by cutting the wafer 1 through dicing lines provided on the wafer 1 in advance by use of a dicing saw 7. As a result, the wafer 1 is divided into pieces of semiconductor devices 10. Since the semiconductor devices 10 are stuck on the dicing tape 6 after becoming individual pieces, they are not scattered and lost by falling off from the dicing tape 6.

After the dicing step, the semiconductor devices 10 in the form of individual pieces are carried to a mounting apparatus together with the frame 5. In the mounting apparatus, ultraviolet light is shone first so as to reduce the strength of the adhesive that sticks the semiconductor devices 10. Thereafter, the semiconductor devices 10 are pushed up by pushing pins 11, so that the semiconductor devices 10 are separated from the dicing tape 6.

The semiconductor devices 10 taken off from the dicing tape 6 are sucked and captured by a collet 8, then carried to a board 9. The semiconductor devices 10 are mounted on the board 9, thereby completing the implementation process.

As described above, flatting of the wafer 1 is generally performed by mechanically grinding the back surface of the devices (FIG. 1B). At this back-grinding step, the grinding head 4 is rubbed against the back surface of the wafer 1. This results in minute scars being left on the finished back surface of the wafer 1, which are called back-grinding marks.

FIG. 2 is an illustrative drawing showing back-grinding marks. As shown in FIG. 2, back-grinding marks 12 are formed in the spiral form on the wafer 1. The back-grinding marks 12 remain even after the wafer 1 are divided into pieces of the semiconductor devices 10.

Consideration is now given to the shape of the back-grinding marks 12 formed on the pieces of the semiconductor devices 10. Dicing lines on the wafer 1 shown in FIG. 2 are supposed to extend in both the X direction and the Y direction.

As indicated by an arrow A in FIG. 2, a semiconductor device 10Y cut out of the wafer 1 has the back-grinding marks 12 generally extending in the Y direction. A semiconductor device 10X cut out of the wafer 1 as indicated by an arrow B in FIG. 2 has the back-grinding marks 12 generally extending in the X direction. In this manner, when the back-grinding marks 12 are generated on the wafer 1 in the spiral form, there will be always the semiconductor devices 10X and 10Y that have back-grinding marks 12 generally extending in the direction of dicing lines (i.e., the X direction and the Y direction).

FIG. 3 is an illustrative drawing showing the way the semiconductor devices are pushed up by pushing pins.

As shown in FIG. 3, the semiconductor devices 10X and 10Y having the back-grinding marks 12 thereon are taken off from the dicing tape 6 by use of the pushing pins 11. When this is done, a force F1 is applied to the semiconductor devices 10X and 10Y. This force F1 serves to bend the semiconductor devices 10X and 10Y as shown in FIG. 4 (i.e., forces F2 are applied as shown in FIG. 4).

The semiconductor devices 10X and 10Y has the back-grinding marks 12 that generally extend in the direction of dicing lines, i.e., in the direction parallel to the edges of the semiconductor devices 10. Compared with other pieces of the semiconductor devices 10, the semiconductor devices 10X and 10Y are thus weaker in terms of their structural strength, thereby possibly suffering chipping or cracking that originates from the back-grinding marks 12.

There is also a risk that a crystal defect such as cracked layers and micro cracks exists under the back-grinding marks 12. The back-grinding marks 12, the cracked layers, and the micro cracks may cause a chip crack or break.

The back-grinding marks 12 may also results in chipping being created on the wafer edges at the time of dicing the wafer. Such chipping may create further chipping or cracking.

When the wafer 1 having a thickness of 100 micrometers after back-grinding is divided into 8-mm-by-8-mm pieces of semiconductor devices 10, and the strength of pieces is measured through three-point bending test, for example, the test indicates an average of 2.8 N with a maximum of 3.4 N and a minimum of 2 N. When the semiconductor devices 10 are picked up by the pushing pins 11 (13 pins) from the dicing tape 6, the tolerable strength (which is required of the semiconductor devices 10 so as not to be broken) is known to be 1.8 N based on the computation and experiment.

This tolerable strength is very close to the minimum (2 N) of the strength of pieces obtained in the test, with only a little margin to spare. If the dicing tape 6 has a portion where adhesion is strong because of a variation in the effect of an adhesive, it is likely that the semiconductor devices 10 will suffer a crack.

It is thus desirable to take a countermeasure with respect to some of the semiconductor devices 10 that are weak in their structural strength, thereby increasing the minimum strength of the semiconductor devices 10. An example of such a countermeasure includes chemical etching by use of a chemical substance. Such a method requires a rather expensive facility and use of a large amount of chemical substance, thereby results in a significant const increase.

Accordingly, there is a need for a method of manufacturing semiconductor devices that can improve the structural strength of flattened semiconductor devices without increasing manufacturing costs.

SUMMARY OF THE INVENTION

It is a general object of the present invention to provide a method of making a semiconductor device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a method of making a semiconductor device particularly pointed out in the specification in such full, clear, concise, and exact terms as to enable a person having ordinary skill in the art to practice the invention.

To achieve these and other advantages and in accordance with the purpose of the invention, as embodied and broadly described herein, a method of making a semiconductor device according to the present invention includes a back-grinding step of grinding a back surface of a semiconductor substrate, a dicing step of dicing the semiconductor substrate along predetermined dicing lines so as to make pieces of semiconductor devices after the back-grinding step, and a laser exposure step of shining laser light on the back surface of the semiconductor substrate after the back-grinding step so as to remove grinding marks generated by the back-grinding step.

According to the method described above, the laser exposure step that is performed after the back-grinding step effects laser illumination to remove the back-grinding marks created by the back-grinding step on the back surface of the semiconductor substrate, thereby improving the structural strength of the semiconductor device.

According to another aspect of the present invention, a method of making a semiconductor device includes a back-grinding step of grinding a back surface of a semiconductor substrate, a dicing step of dicing the semiconductor substrate along predetermined dicing lines so as to create pieces of semiconductor devices after the back-grinding step, and a grinding-mark generating step of generating grinding marks that extend in a direction different from directions of the predetermined dicing lines between the back-grinding step and the dicing step, the grinding marks being generated by grinding the back surface of the semiconductor substrate by a grinding apparatus that includes a plurality of end-mills.

According to the method described above, the grinding apparatus that has a plurality of end-mills is employed, so that grinding marks are created as irregular patterns. The semiconductor device thus exhibits sufficient strength regardless of the direction in which a stress is applied, thereby improving reliability.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

FIGS. 5A through 5F are illustrative drawings showing a method of manufacturing semiconductor devices according to a first embodiment of the present invention. Some of the features of the present invention mainly reside in the back-grinding step, dicing step, and mounting step. Other steps are the same as those of a conventional manufacturing method. In the figures, therefore, the back-grinding step, dicing step, and mounting step are illustrated, and a description of other steps will be omitted.

Further, in the description of embodiments that follows and the drawings associated therewith, the same elements as those of FIGS. 1A–1E through FIG. 4 are referred to by the same numerals.

Figure 5A:
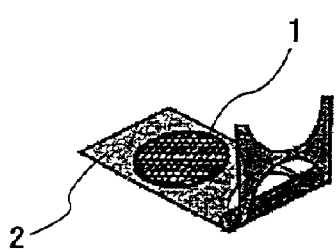
FIGS. 5A through 5F are illustrative drawings showing a method of manufacturing semiconductor devices according to a first embodiment of the present invention.

As shown in FIG. 5A, the wafer 1 for which the wafer process is completed has a surface protection tape 2 adhered thereto. The surface of the wafer 1 on which the circuits are formed is covered by the surface protection tape 2. With this provision, the circuits formed on the wafer 1 are protected by the surface protection tape 2.

The wafer 1 having the surface protection tape 2 stuck thereon is mounted on the wafer chuck table 3 of a back-grinding apparatus. As shown in FIG. 5B, the back surface of the wafer 1 is ground by the grinding head 4 (e.g., a grindstone having a grain size classification of #2000) (i.e., back-grinding step). This back-grinding step is the same as that of the related art.

Figure 1A:
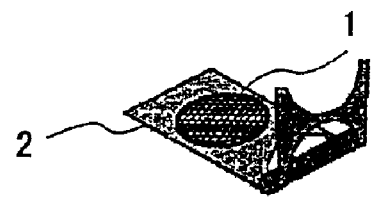
FIGS. 1A through 1E are drawings showing an example of process steps concerning a related-art method of manufacturing a semiconductor device.
Figure 1B:
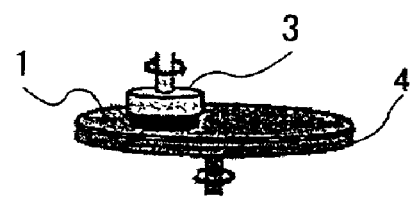
Figure 1C:
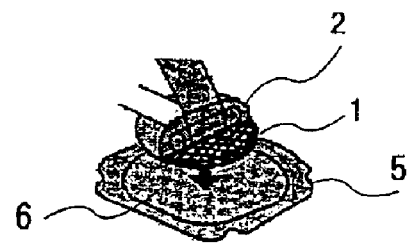
Figure 1D:
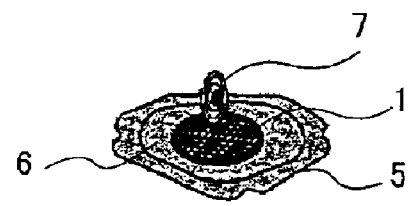
Figure 1E:
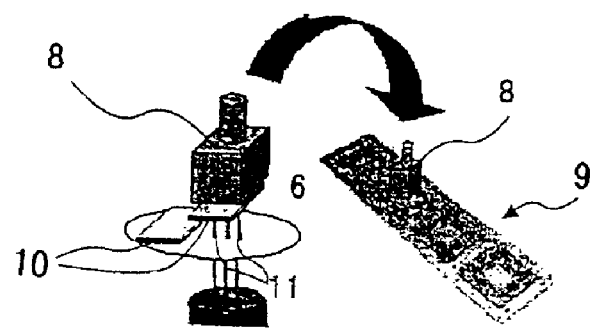
Figure 2:
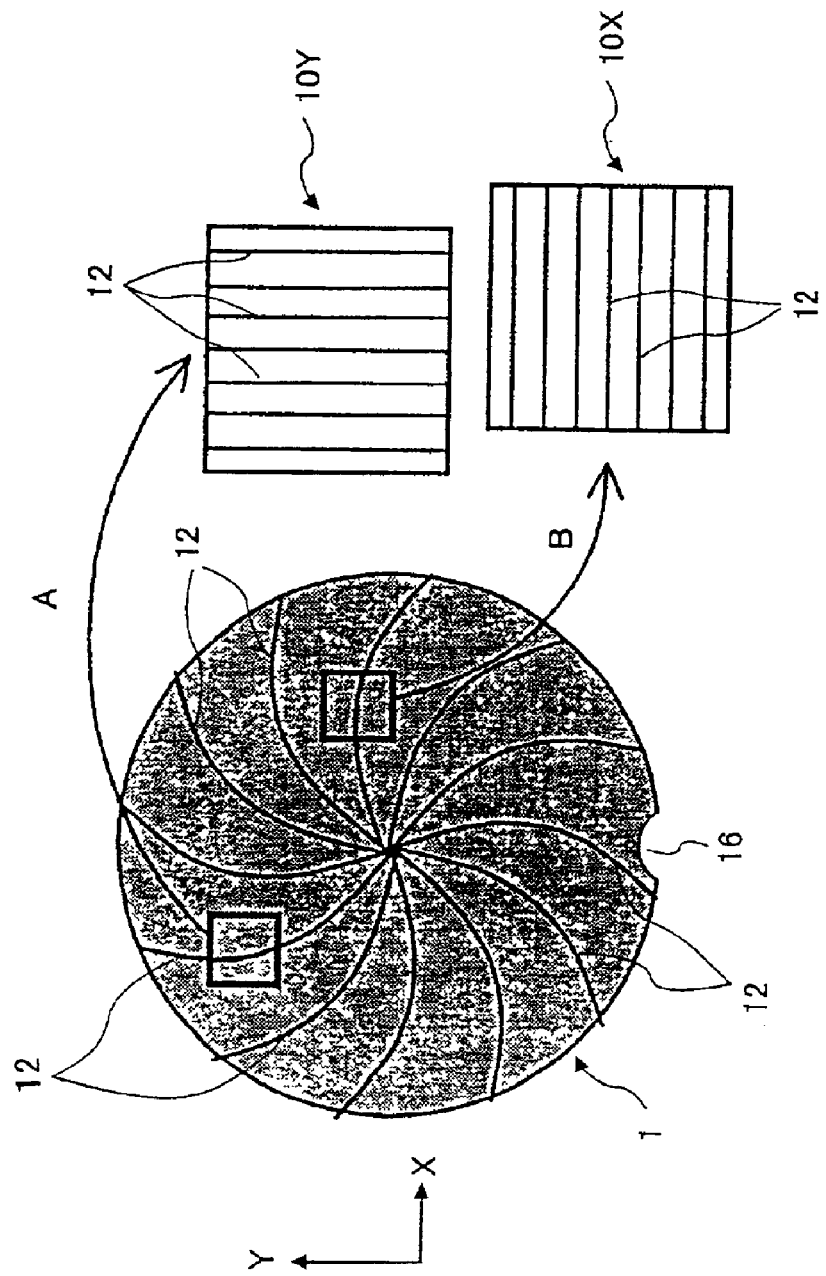
FIG. 2 is an illustrative drawing showing back-grinding marks.

As previously described, the finished back surface of the wafer 1 has the back-grinding marks 12 after the back-grinding step. The back-grinding marks 12 has the same shape that was described in connection with FIG. 2, i.e., a spiral form on the wafer 1.

In this embodiment, a grinding-mark generating step is performed after the back-grinding step.

At the grinding-mark generating step, the back-grinding marks 12 generated by the back-grinding step are removed, and grinding marks 20A are newly generated that extend in a direction different from the directions of dicing lines (the X direction and the Y direction). In this embodiment, a grinding-mark generating roller 14 is used to create the grinding marks 20A.

Figure 6:
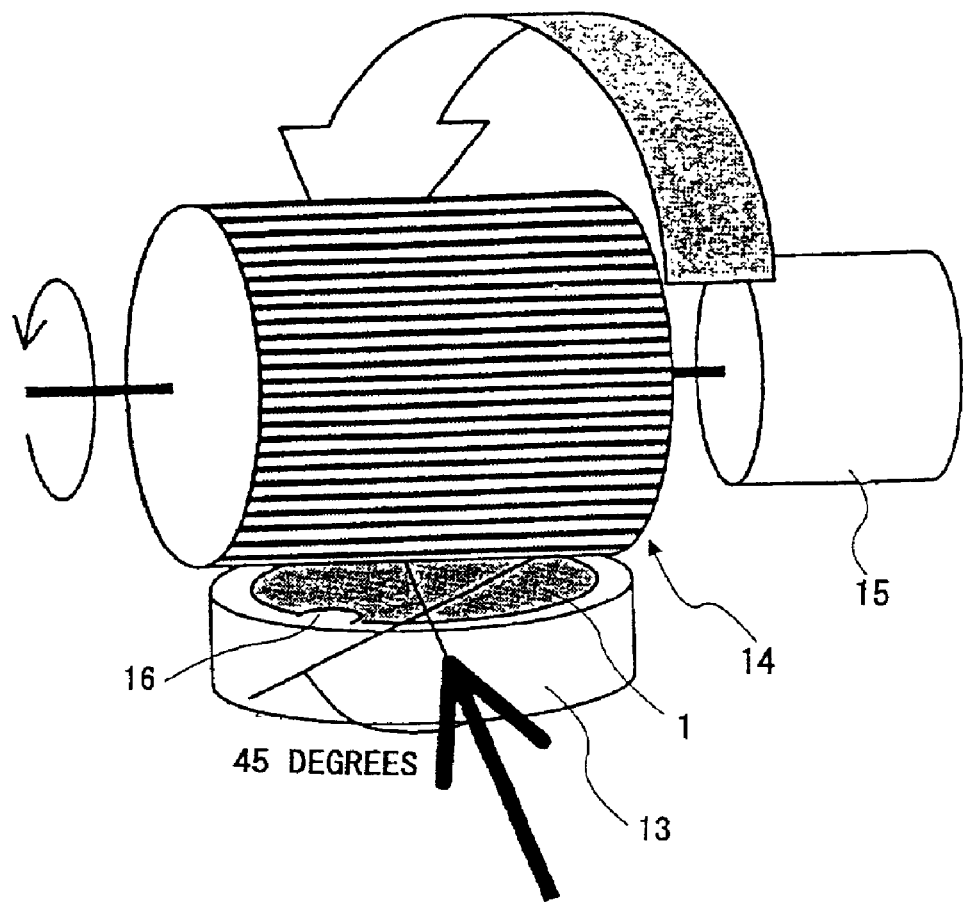
FIG. 6 is an enlarged view of a grinding-mark generating roller.
Figure 7:
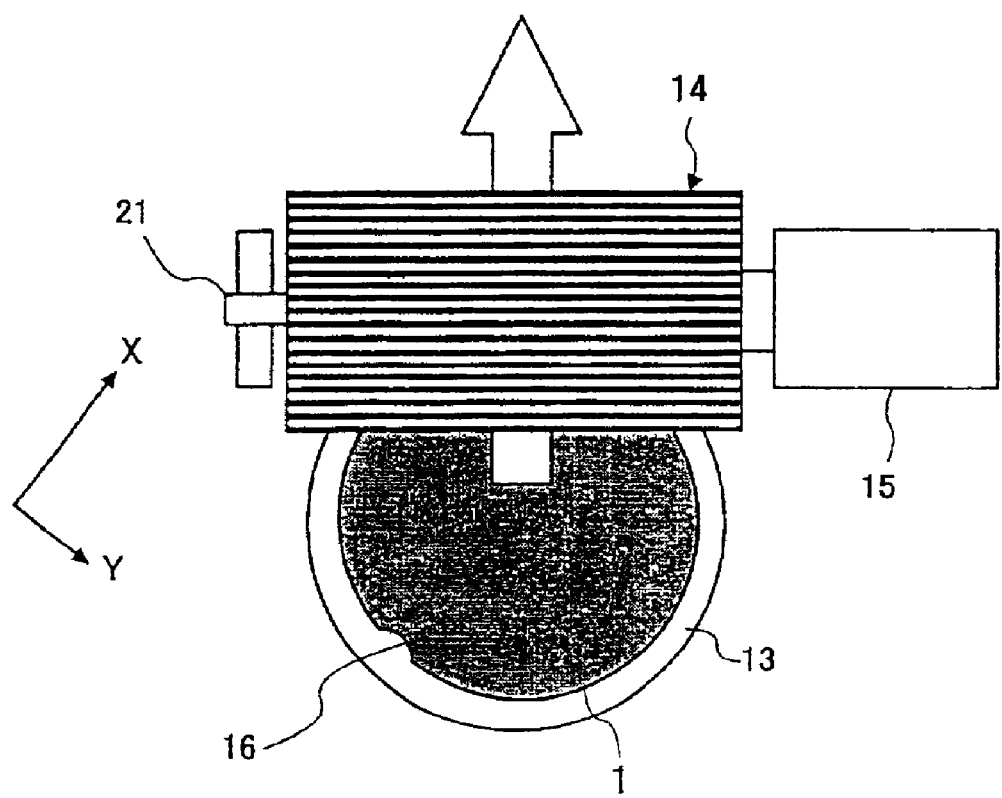
FIG. 7 is an enlarged plan view of the grinding-mark generating roller.

The grinding-mark generating roller 14 has a cylindrical shape. FIG. 6 and FIG. 7 show enlarged views of the grinding-mark generating roller 14. As shown in FIG. 6 and FIG. 7, the grinding-mark generating roller 14 is rotated by a motor 15. The cylinder of the grinding-mark generating roller 14 may have a diameter of 200 mm, for example, and is rotated by the motor 15 at the rate of 5000 rpm. The surface of the grinding-mark generating roller 14 is covered with grindstone (diamond grindstone), which has a grain size classification of #4000 and a grinding depth of 1 micrometer.

A rotation axis 21 of the grinding-mark generating roller 14 is fixed while a table 13 having the wafer 1 mounted thereon moves in the X direction and the Y direction as shown in FIG. 5 and FIG. 7. When the table 13 passes under the grinding-mark generating roller 14, the wafer 1 mounted on the table 13 comes in contact with the grinding-mark generating roller 14, thereby being subjected to grinding.

Figure 8:
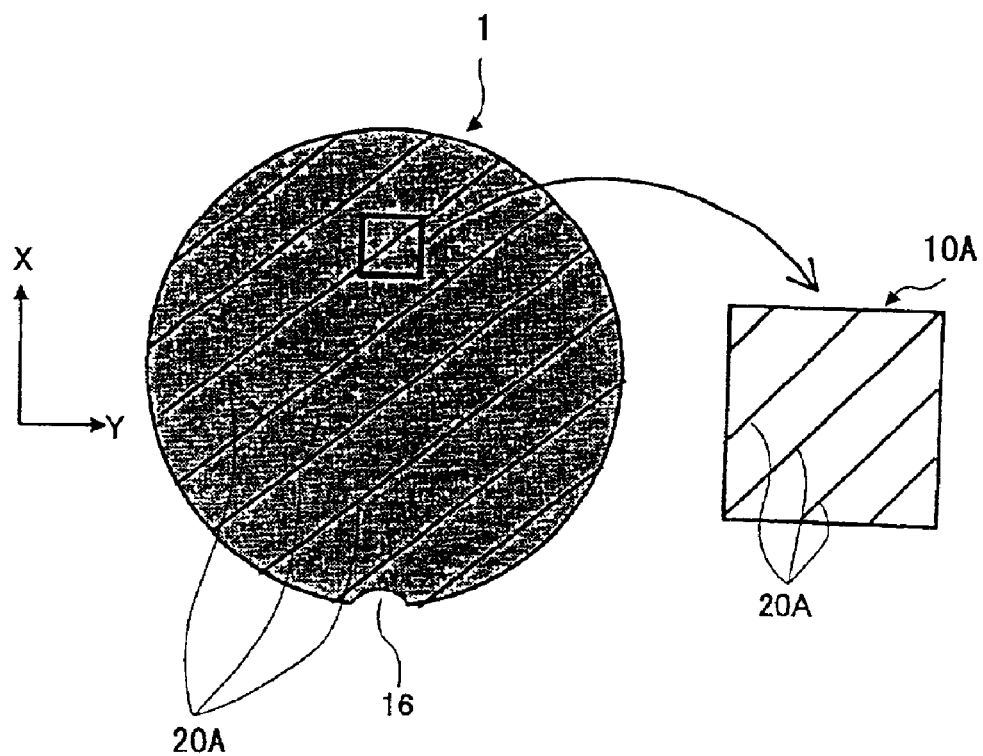
FIG. 8 is an illustrative drawing showing grinding marks formed on a wafer by the grinding-mark generating roller.

In this embodiment, provision is made such that the grinding marks 20A formed on the wafer 1 by the grinding-mark generating roller 14 extend substantially at 45 degrees relative to the dicing lines (the X direction and the Y direction). FIG. 8 is an illustrative drawing showing the grinding marks 20A formed on the wafer 1 by the grinding-mark generating roller 14. As shown in FIG. 8, the grinding marks 20A extend substantially at 45 degrees relative to the dicing lines (the X directions and the Y directions).

This angle is easily controlled by changing the travel direction of the table 13. It is also readily accomplished to change the angle such as to be different from 45 degrees.

Figure 5D:
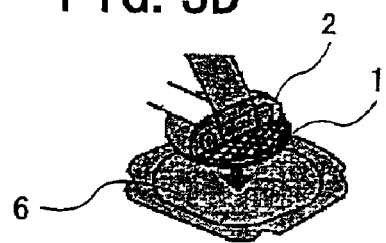
Figure 5B:
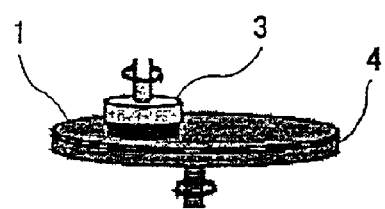
Figure 5E:
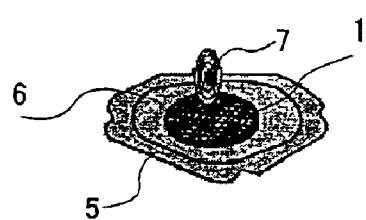
Figure 5C:
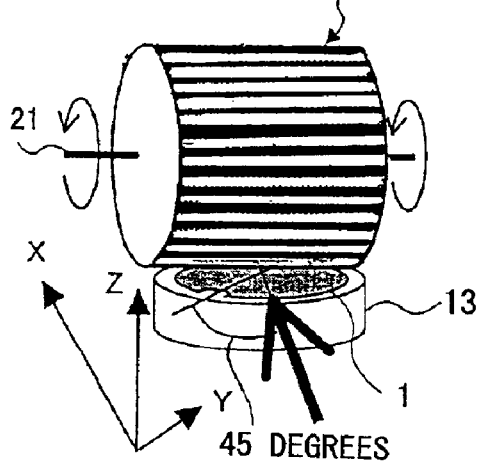

After the grinding-mark generating step, as shown in FIG. 5D, the surface protection tape 2 is taken off from the wafer 1, and the back surface of the wafer 1 is stuck to the dicing tape 6. The dicing tape 6 is provided inside the frame 5, and has a surface thereof to which an adhesive (e.g., an adhesive that cures upon exposure to ultraviolet light) is applied so as to have the wafer 1 adhere thereto.

The wafer 1 stuck on the dicing tape 6 is carried to a dicing apparatus, where dicing is performed (i.e., a dicing step). The dicing is performed by cutting the wafer 1 through the dicing lines provided on the wafer 1 in advance by use of the dicing saw 7.

As a result, the wafer 1 is divided into pieces of semiconductor devices 10A. Since the semiconductor devices 10A are stuck on the dicing tape 6 after becoming individual pieces, they are not scattered and lost by falling off from the dicing tape 6. Since the dicing lines extend in the direction X and the direction Y, the semiconductor devices 10A have side edges thereof extending in the X direction and the Y direction.

After the dicing step, the semiconductor devices 10A in the form of individual pieces are carried to a mounting apparatus together with the frame 5. In the mounting apparatus, ultraviolet light is shone first so as to reduce the strength of the adhesive (that cures upon exposure to ultraviolet) that sticks the semiconductor devices 10A.

Figure 3:
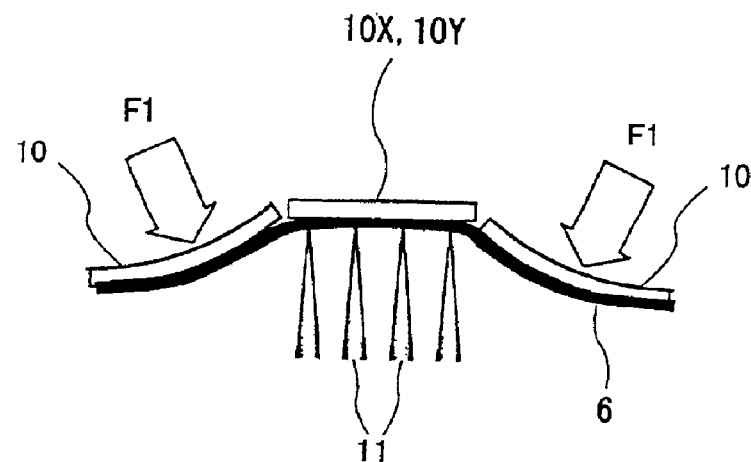
FIG. 3 is an illustrative drawing showing the way a semiconductor device is pushed up by pushing pins.
Figure 4:
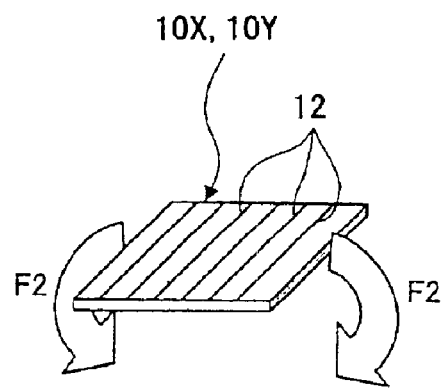
FIG. 4 is an illustrative drawing showing forces applied to a semiconductor device.
Figure 9:
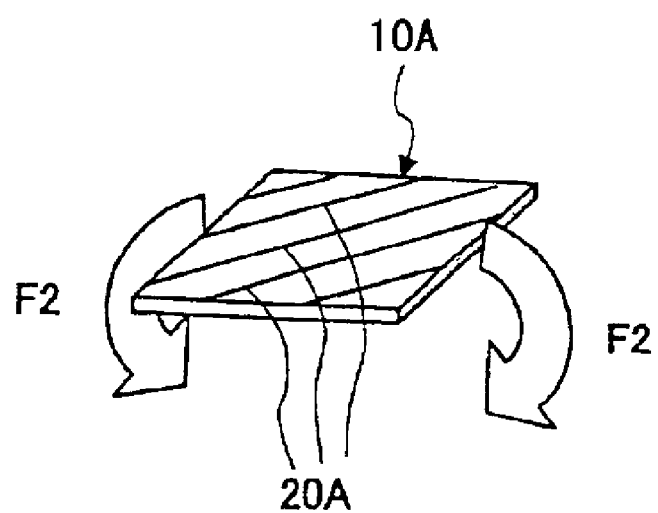
FIG. 9 is an illustrative drawing showing forces applied to a semiconductor device.
Figure 10A:
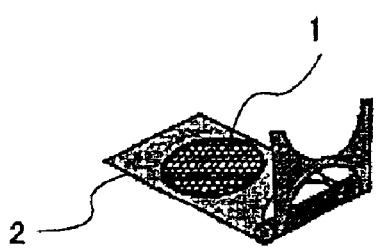
FIGS. 10A through 10F are illustrative drawings showing a method of manufacturing semiconductor devices according to a second embodiment of the present invention.
Figure 10D:
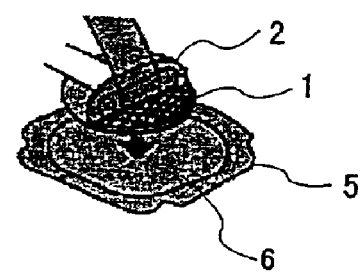
Figure 10B:
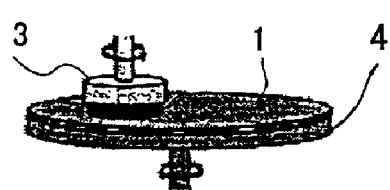
Figure 10E:
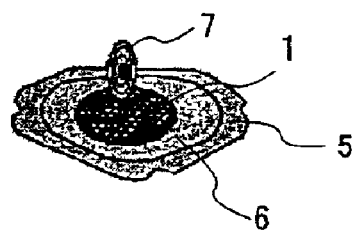
Figure 10C:
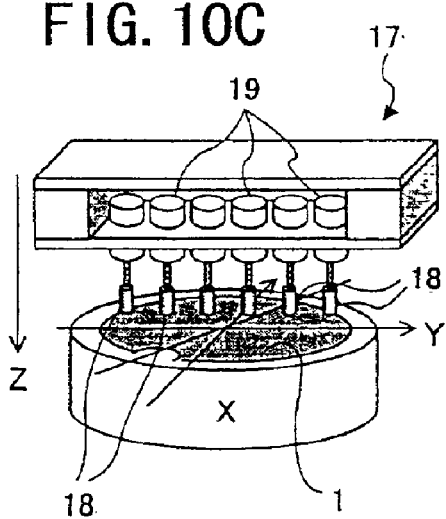
Figure 10F:
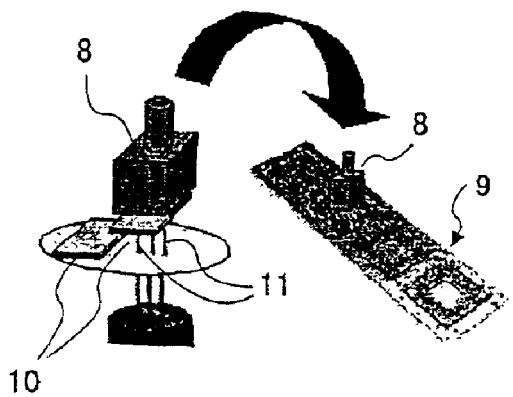

Thereafter, the semiconductor devices 10A are pushed up by the pushing pins 11, so that the semiconductor devices 10A are separated from the dicing tape 6. As was described in connection with FIG. 3, the force F1 is applied to the semiconductor devices 10A at the time of pushing up. This force F1 serves as forces F2 to bend the semiconductor devices 10A as shown in FIG. 9.

In this embodiment, however, the grinding marks 20A are formed in the direction different from the direction of scribe lines (which extend in the X direction and the Y direction, i.e., in the direction in which the side edges of the semiconductor devices 10A extend). In detail, the grinding marks 20A extend at 45 degrees relative to the scribe lines. The semiconductor devices 10A are thus more robust to the stress than the semiconductor devices 10X and 10Y (see FIG. 4) which have the back-grinding marks 12 thereof extending in the directions of scribe lines.

When the thickness of a semiconductor device is 400 micrometers, the semiconductor device has the strength of 11 N if the grinding marks extend in the direction of scribe lines (i.e., the direction of side edges), and has the strength of 30 N if the grinding marks extend at 45 degrees. When the thickness of the semiconductor device is 100 micrometers, the semiconductor device has the strength of 0.8 N with the 0-degree setting, and has the strength of 1.7 N with the 45-degree setting.

Figure 5F:
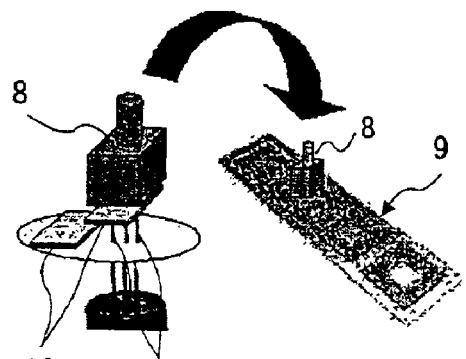

The semiconductor devices 10A taken off from the dicing tape 6 are sucked and captured by the collet 8 as shown in FIG. 5F, then carried to the board 9. The semiconductor devices 10A are mounted on the board 9, thereby completing the implementation process.

In the embodiment described above, the grinding-mark generating roller 14 rotates on the wafer 1, thereby removing the back-grinding marks 12 and creating the grinding marks 20A. With the provision that the rotation axis 21 of the grinding-mark generating roller 14 is set in a different direction than the dicing lines, the grinding marks 20A will be formed that extend in a different direction than the dicing lines. In this manner, the grinding marks 20A extending in a direction different from that of the dicing lines can be easily formed.

Even if the back-grinding step results in the back-grinding marks 12 extending in the directions of dicing lines, the subsequent grinding-mark generating step creates the grinding marks 20A that extend in a different direction than the dicing lines, thereby making it possible to improve the structural strength of the semiconductor devices 10A.

In the following, a method of manufacturing a semiconductor device according to a second embodiment of the present invention will be described.

FIGS. 10A through 10F are illustrative drawings showing a method of manufacturing semiconductor devices according to the second embodiment of the present invention.

The method of manufacturing a semiconductor device according to this embodiment differs from that of the first embodiment only in the grinding-mark generating step, and other steps are identical between these two embodiments. In the description that follows, therefore, the grinding-mark generating step will only be described, and a description of other steps will be omitted.

In this embodiment also, the grinding-mark generating step removes the back-grinding marks 12 formed through the back-grinding step, and creates grinding marks 20B in a direction different from the directions of dicing lines (the X direction and the Y direction). In this embodiment, a grinding apparatus 17 creates the grinding marks 20B.

Figure 11:
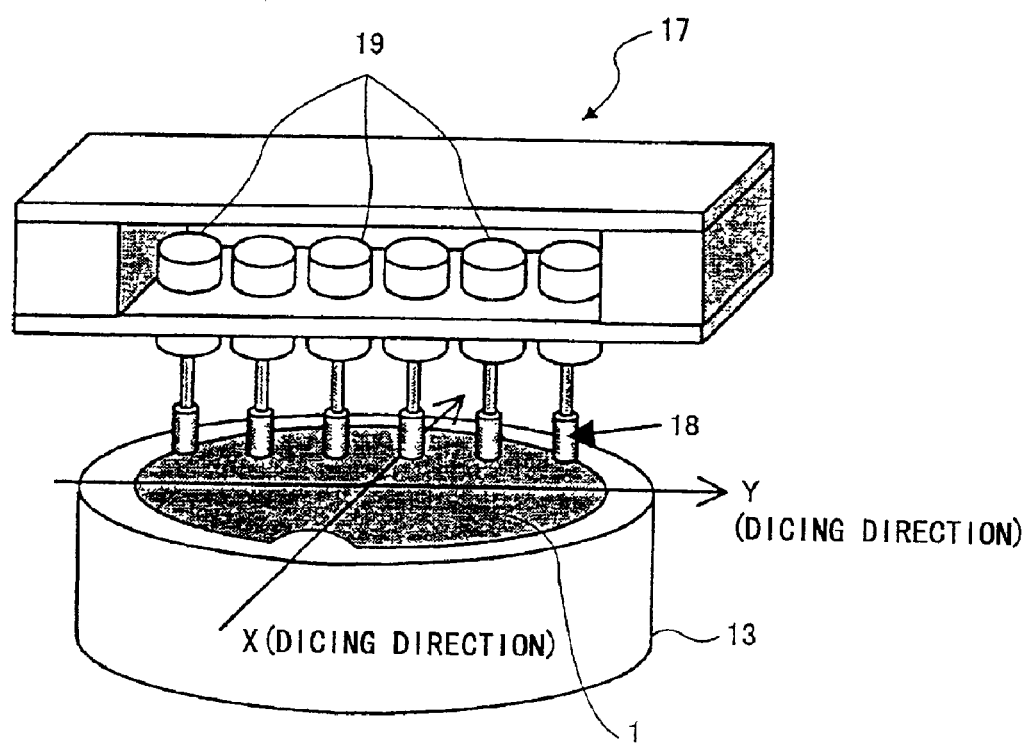
FIG. 11 is an illustrative drawing showing an enlarged view of a grinding apparatus.

FIG. 11 is an illustrative drawing showing an enlarged view of the grinding apparatus 17.

The grinding apparatus 17 has a plurality of end-mills 18 (6 mills in this example) that are rotated by motors 19. The end-mills 18 each have a diameter of 5 mm, and are directly connected to the respective motors 19. The end-mills 18 pass over the wafer 1 while they rotate, thereby removing the back-grinding marks 12 formed by the back-grinding step and newly creating the grinding marks 20B.

Figure 12:
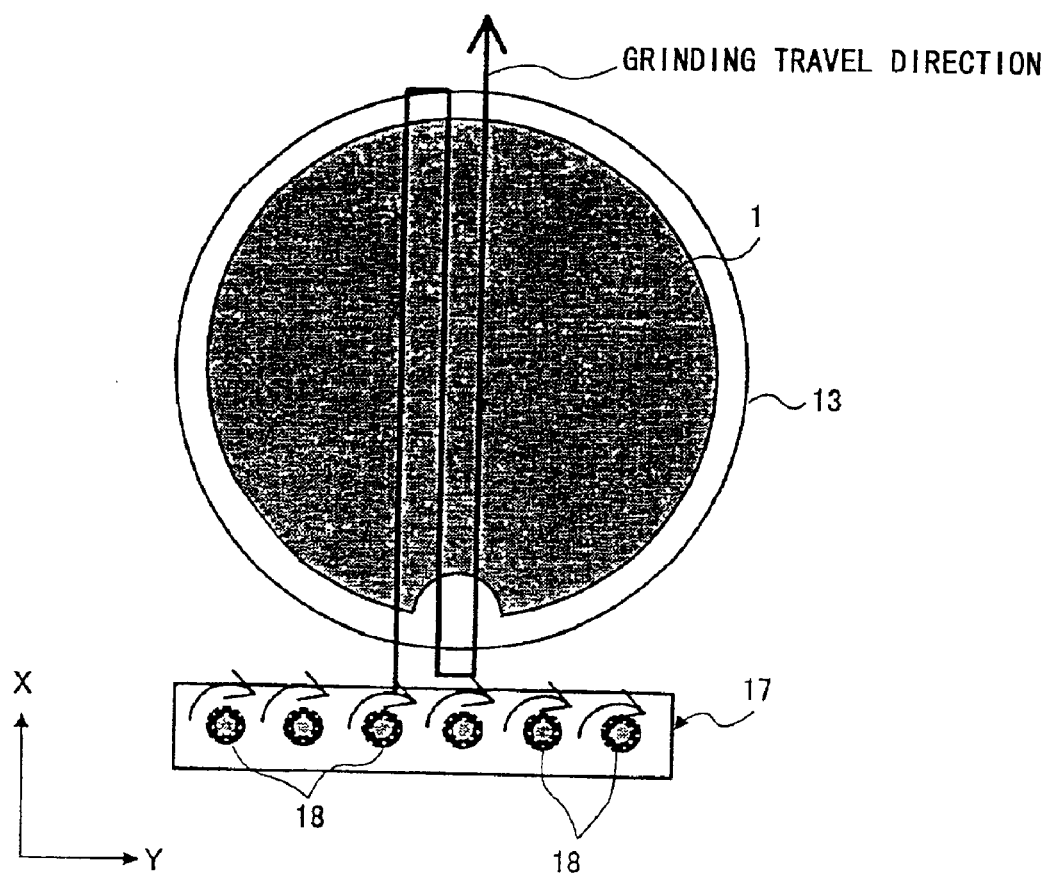
FIG. 12 is an illustrative drawing for explaining the direction of grinding.

The wafer 1 is securely mounted on the table 13 through the vacuum mechanism, and the grinding apparatus 17 moves on the wafer to grind it. In this example, it is the grinding apparatus 17 that moves while the wafer 1 is fixed on the table 13. In detail, as shown in FIG. 12 for explaining the direction of grinding, the grinding apparatus 17 moves in the X direction while the end-mills 18 grinds the wafer 1.

Figure 13:
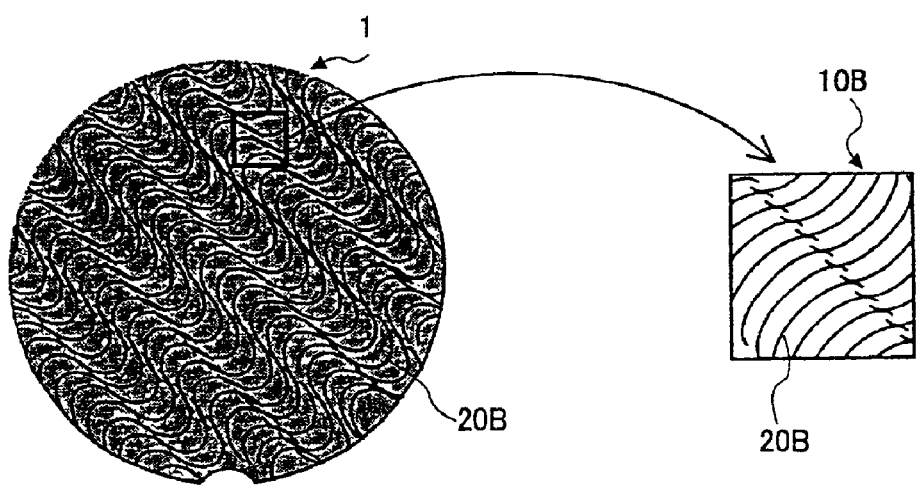
FIG. 13 is an illustrative drawing showing grinding marks.

After going past the wafer 1, the grinding apparatus 17 moves 3 mm in the Y direction, and then moves in the X direction to continue the grinding of the wafer 1. This is repeated thereafter, thereby having the end-mills 18 apply grinding all over the back surface of the wafer 1. FIG. 13 is an illustrative drawing showing the grinding marks 20B generated in this manner. Since the end-mills 18 moves on the wafer 1 while rotating to apply grinding, the wafer 1 will have the grinding marks 20B that have no particular direction as shown in FIG. 13.

Figure 14:
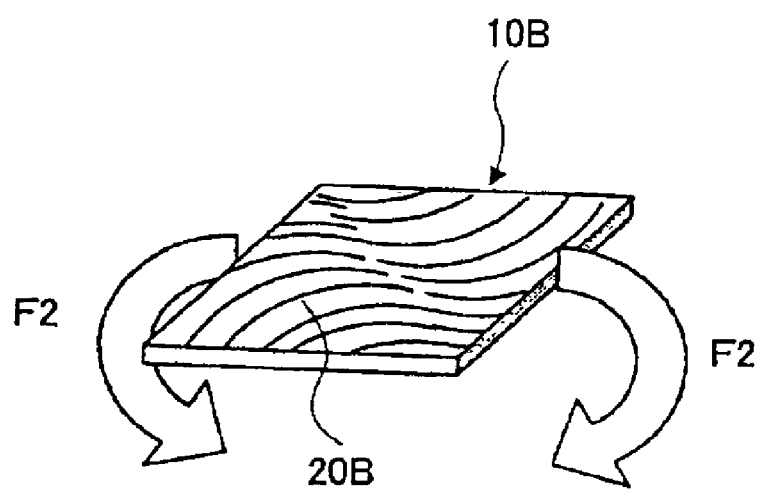
FIG. 14 is an illustrative drawing showing forces applied to a semiconductor device.
Figure 15A:
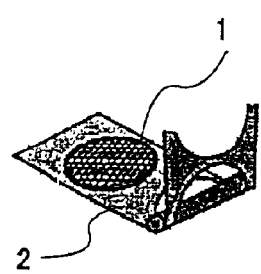
FIGS. 15A through 15F are illustrative drawings showing a method of manufacturing semiconductor devices according to a third embodiment of the present invention.
Figure 15D:
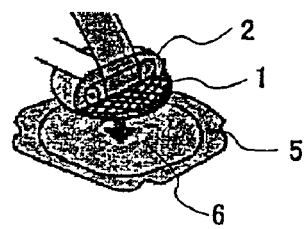
Figure 15B:
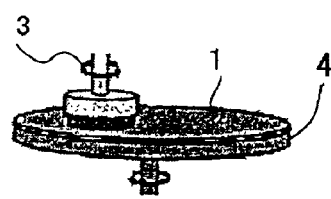
Figure 15E:
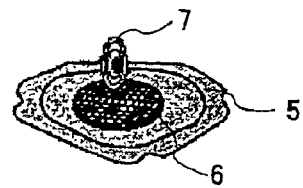
Figure 15C:
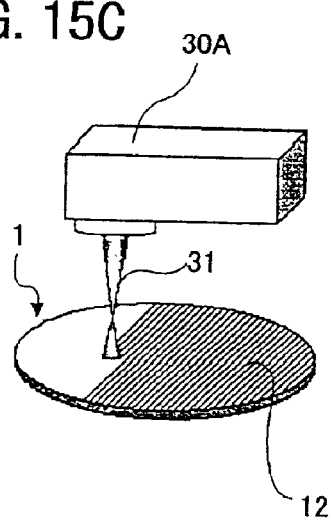
Figure 15F:
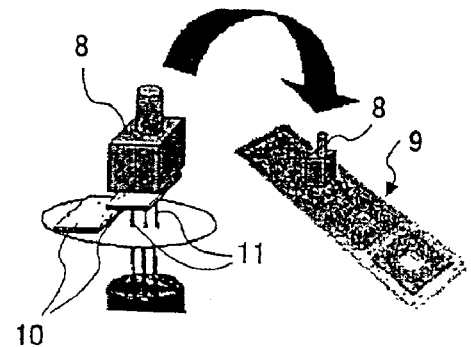

When the wafer 1 having the grinding marks 20B formed thereon is divided into pieces to generate the semiconductor devices 10B at the dicing step, the grinding marks 20B will have a pattern on each one of the semiconductor devices 10B as shown in FIG. 14. The semiconductor devices 10B are thus more robust to the stress than the semiconductor devices 10X and 10Y (see FIG. 4) which have the back-grinding marks 12 thereof extending in the directions of scribe lines, thereby preventing chipping and cracking. In this embodiment, the grinding marks 20B have irregular patterns without any particular directionality, and, thus, exhibits sufficient strength regardless of the direction in which the force F2 is applied. This improves the reliability of the manufactured semiconductor devices 10B.

In the following, a method of manufacturing a semiconductor device according to a third embodiment of the present invention will be described.

FIGS. 15A through 15F are illustrative drawings showing a method of manufacturing semiconductor devices according to the third embodiment of the present invention.

The method of manufacturing a semiconductor device according to this embodiment differs from that of the first embodiment only in that a laser exposure step is performed in place of the grinding-mark generating step, and other steps are identical between these two embodiments. In the description that follows, therefore, the laser exposure step will only be described, and a description of other steps will be omitted.

In this embodiment, the laser exposure step will be carried out after completion of the back-grinding step. At the laser exposure step, a laser exposure apparatus 30A shines laser light 31 on the wafer 1 having the back-grinding marks 12 formed thereon. The laser exposure apparatus 30A has a mechanism for scanning the laser light beam 31, so that the laser light beam 31 will be shone all over the back surface of the wafer 1.

Figure 19:
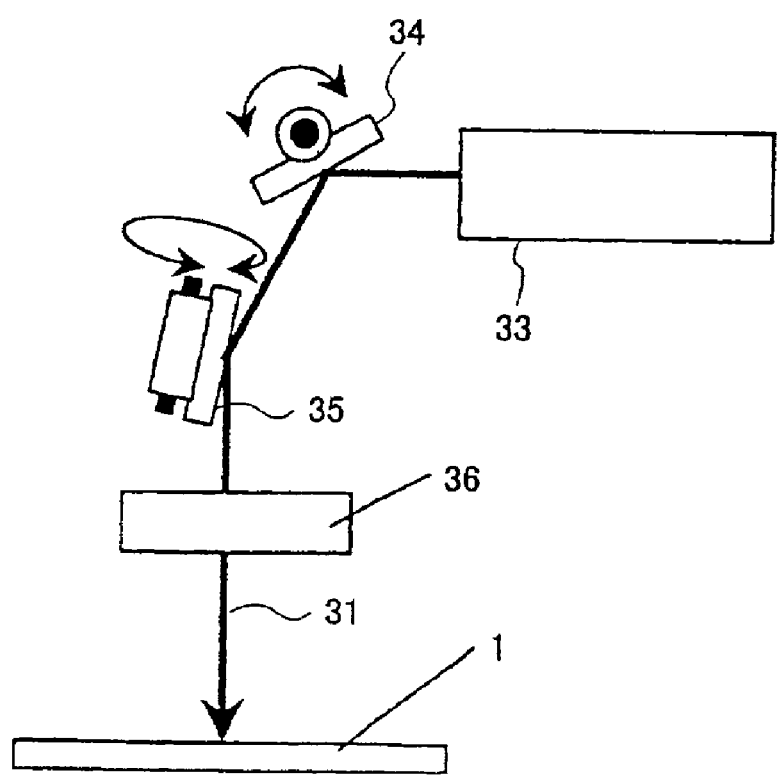
FIG. 19 is an illustrative drawing showing a configuration of a laser exposure apparatus with the detail of a scan mechanism.

FIG. 19 is an illustrative drawing showing a configuration of the laser exposure apparatus 30A with the detail of the scan mechanism. A laser generation apparatus 33 generates the laser beam 31. In this embodiment, the wavelength of laser light emitted by the laser generation apparatus 33 ranges between 200 nm and 700 nm.

The depth which the laser light can reach in a semiconductor material (e.g., the wafer 1) depends largely on the wavelength of the laser light. The longer the wavelength, the deeper the laser light can reach. If the wafer 1 is too thin, laser illumination on the back surface may affect the circuit layers that are formed on the opposite surface. The wavelength of laser light thus needs to be selected in accordance with the thickness of the wafer. If the thickness of the wafer 1 is less than 50 micrometers, for example, the laser beam 31 may be employed that has a wavelength of 200 nm to 450 nm. If the wafer 1 is more than 50 micrometers in thickness, the laser beam 31 having a wavelength of 200 nm to 700 nm may be used.

In terms of a pulse length of the laser beam 31 generated by the laser generation apparatus 33, this embodiment employs a laser pulse length of 100 fs to 200 μs.

The laser beam 31 is absorbed inside the wafer 1 (i.e., inside silicon), and is converted into heat. A thermal diffusion distance in this case is $(4\,kt)^{1/2}$ (k: thermal diffusion factor, t: pulse length). Thus, use of an increased pulse length will result in an increased likelihood of active thermal process because there is an increasingly sufficient time for heat to propagate inside silicon to cause melting.

If the pulse length is sufficiently short, little thermal diffusion occurs. In this case, light energy is transferred to the lattice system, thereby destroying the molecule structure and causing non-thermal process. A pulse length of 100 ps to 200 μs causes the behavior of thermal process, so that such a pulse length is used for semiconductor devices that are relatively robust against heat. In this case, heat will propagate to other areas by going beyond the illuminated area, so that the scan pitch can be set to a relatively long pitch when scanning the laser beam 31 over the back surface. This results in a short processing time. Use of a pulse length of 100 fs to 100 ps causes the behavior of non-thermal process, so that such a pulse length will be used for semiconductor devices that are susceptible to heat.

In the following, the scan mechanism of the laser exposure apparatus 30A will be described.

Figure 17:
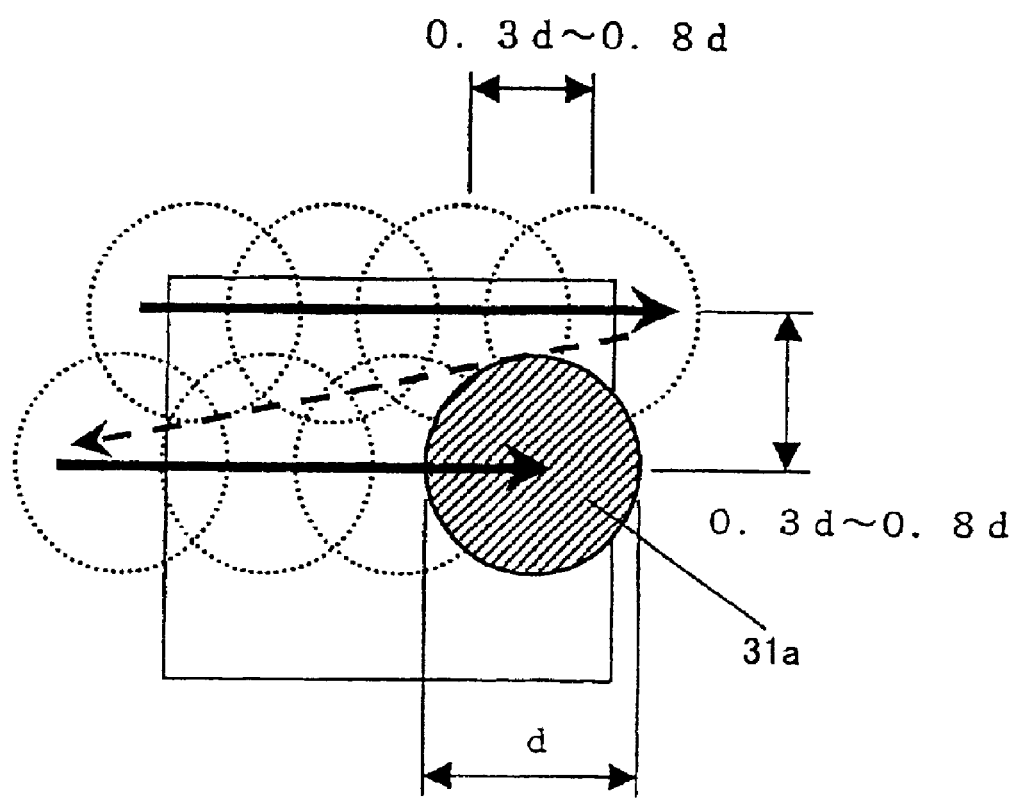
FIG. 17 is an illustrative drawing for explaining laser beam scans.

FIG. 17 is an illustrative drawing for explaining laser beam scans. As shown in FIG. 17, a laser spot 31a has a spot diameter d thereof that is set equal to 10 μm to 100 μm, and is scanned on the back surface of the wafer 1 or the semiconductor devices 10. In this embodiment, an X-direction galvano mirror 34 and a Y-direction galvano mirror 35 are used to scan the laser spot 31a (i.e., the laser beam 31). The laser beam 31 reflected by the galvano mirrors 34 and 35 is shone on the wafer 1 through a conversion lens 36.

The X-direction galvano mirror 34 changes the travel direction of the laser beam 31 in the X direction as the laser beam 31 is emitted from the laser generation apparatus 33. The Y-direction galvano mirror 35 controls the travel direction of the laser beam 31 in the Y direction as the laser beam 31 is emitted from the laser generation apparatus 33. The galvano mirrors 34 and 35 rotate independently of each other. By combining the rotations of the galvano mirrors 34 and 35, the laser beam 31 is scanned on the wafer 1 in the X direction and the Y direction.

In this configuration, the position of illumination by the laser beam 31 is changed by an optical system, so that high speed scans are possible. Since the range that can be covered by laser illumination is rather small, this configuration is applied to the wafer 1 of a relatively small size.

As shown in FIG. 17, the scan pitch of the laser beam 31 may be set to 30% to 80% of the diameter of the laser spot 31a, thereby insuring that the laser spots 31a partially overlap between adjacent scans. If the pulse length of the laser beam 31 is 100 ps to 200 μs, the setting of 50% to 80% of the diameter of the laser spot 31a will achieve a highly smooth finish because of the thermal process. In the case of a short pulse of 100 fs to 100 ps, however, a short scan pitch of 30% to 60% is preferable because the non-thermal process is limited only within the illuminated area.

Figure 20:
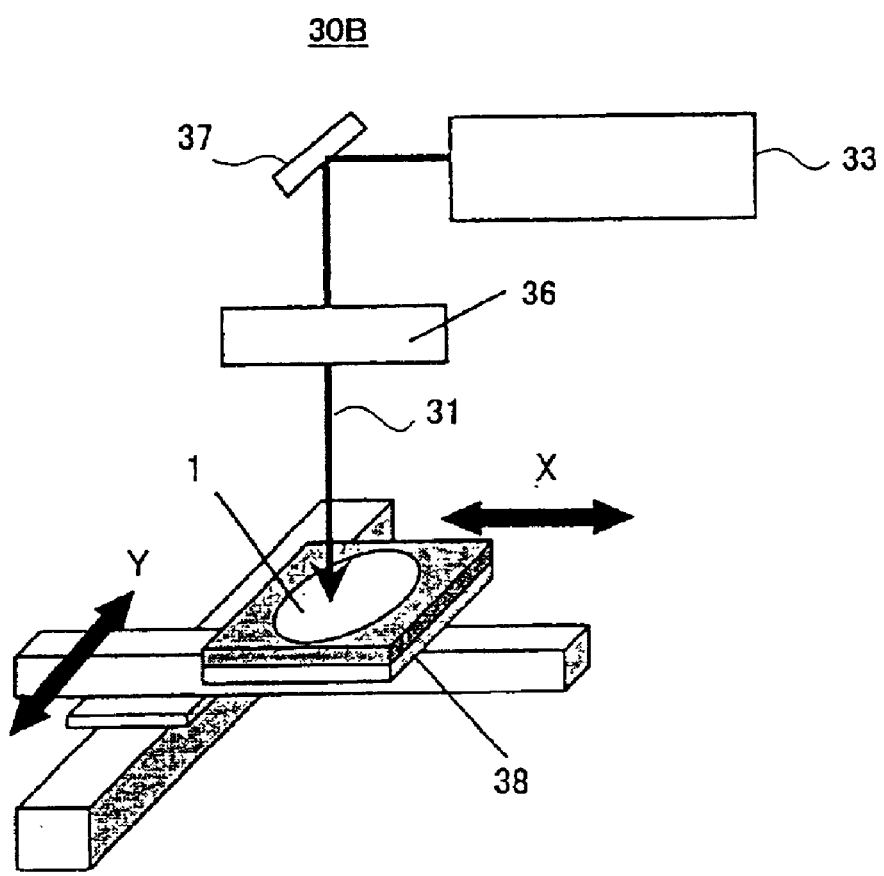
FIG. 20 is an illustrative drawing showing a scan mechanism based on the use of a table.

The scan mechanism of the present invention is not limited to the configuration that uses the galvano mirrors 34 and 35. FIG. 20 is an illustrative drawing showing a scan mechanism based on the use of a table. In FIG. 20, the a laser exposure apparatus 30B uses an XY table 38 as a scan mechanism. In this configuration, the laser generation apparatus 33 is fixed in its place, and the laser beam 31 emitted from the laser generation apparatus 33 is shone via a mirror 37 on the wafer 1 mounted on the XY table 38. The XY table 38 can move the wafer 1 in the X direction and the Y direction, thereby scanning the laser beam 31 relative to the wafer 1. This configuration allows for a relatively wide area of laser illumination, and is thus useful for the wafer 1 of a large size.

Figure 21:
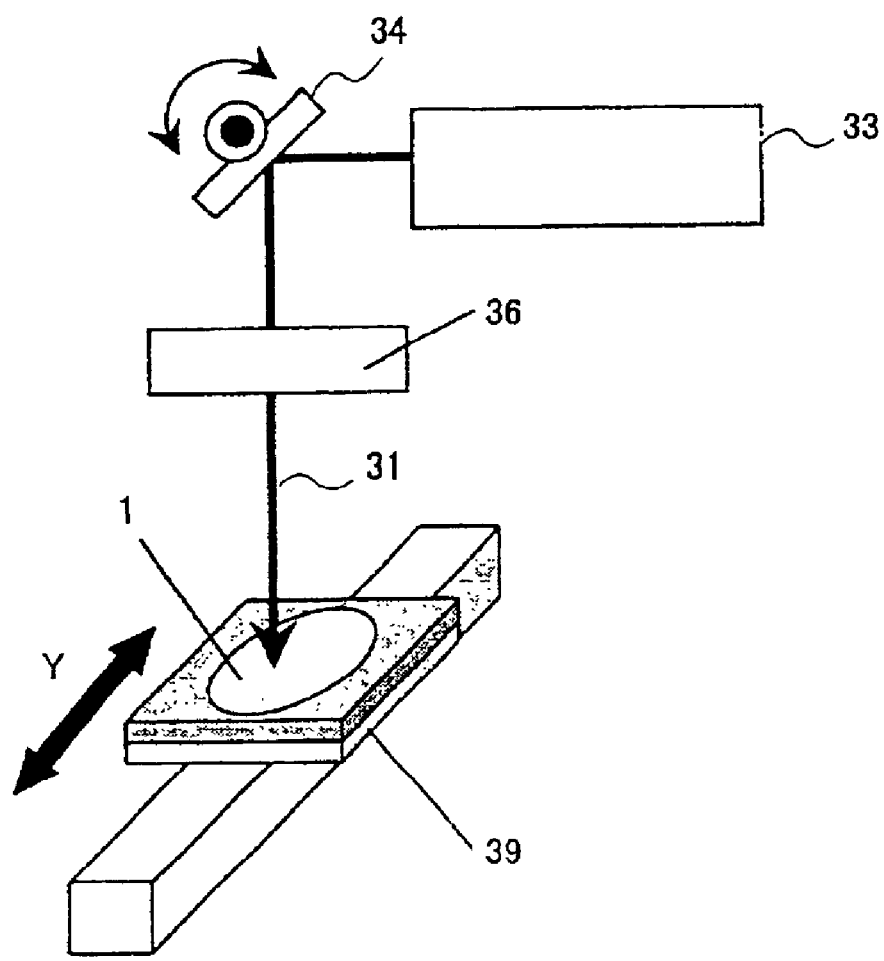
FIG. 21 is an illustrative drawing showing another scanning mechanism.

FIG. 21 is an illustrative drawing showing another scanning mechanism. A laser exposure apparatus 30C of FIG. 21 has a configuration that combines the laser exposure apparatus 30A of FIG. 19 and the laser exposure apparatus 30B of FIG. 20. Namely, the X-direction galvano mirror 34 controls the laser beam 31 in the X direction as the laser beam 31 is emitted from the laser generation apparatus 33, and a Y-direction table 39 is used to scan the laser beam 31 relative to the wafer 1 in the Y direction. In this configuration, a wide area can be scanned at high speed.

Figure 16A:
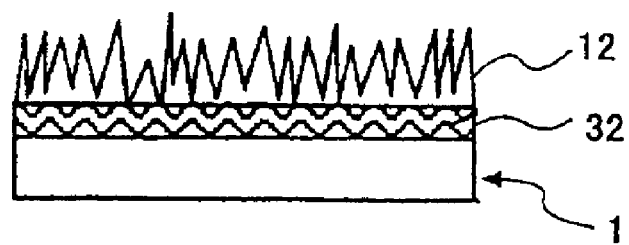
FIG. 16A is an illustrative drawing showing a profile of the back surface of a wafer before a laser exposure step.
Figure 16B:
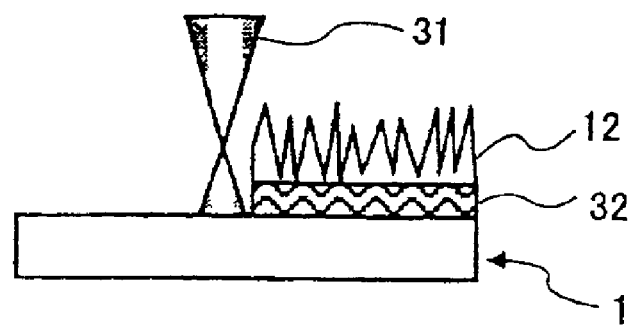
FIG. 16B is an illustrative drawing showing a profile of the back surface of the wafer after the laser exposure step.

In the following, FIGS. 16A and 16B will be referred to, and the condition of the back surface of the wafer 1 will be described with reference to the conditions before and after the laser exposure step. FIG. 16A is an illustrative drawing showing a profile of the back surface of the wafer 1 before the laser exposure step. FIG. 16B is an illustrative drawing showing a profile of the back surface of the wafer 1 after the laser exposure step.

As previously described, the back surface of the wafer 1 has the back-grinding marks 12 formed thereon after the back-grinding step, as shown in FIG. 16A. In the further depth, a cracked layer 32 is formed. In addition to the back-grinding marks 12 and the cracked layer 32, chipping may be present. The back-grinding marks 12, the cracked layer 32, and chipping may cause a further chip crack or breakage when a stress such as a bending force is applied.

Illumination by the laser beam 31 at the laser exposure step removes the back-grinding marks 12, the cracked layer 32, and the chipping as shown in FIG. 16B. After the laser exposure step, the back surface of the wafer 1 is smooth without the back-grinding marks 12, the cracked layer 32, or chipping. This improves the structural strength of the semiconductor devices 10, and reliably prevents chip cracks and breakages even when an external force is applied, e.g., even when they are pushed up by the pushing pins 11.

Figure 18:
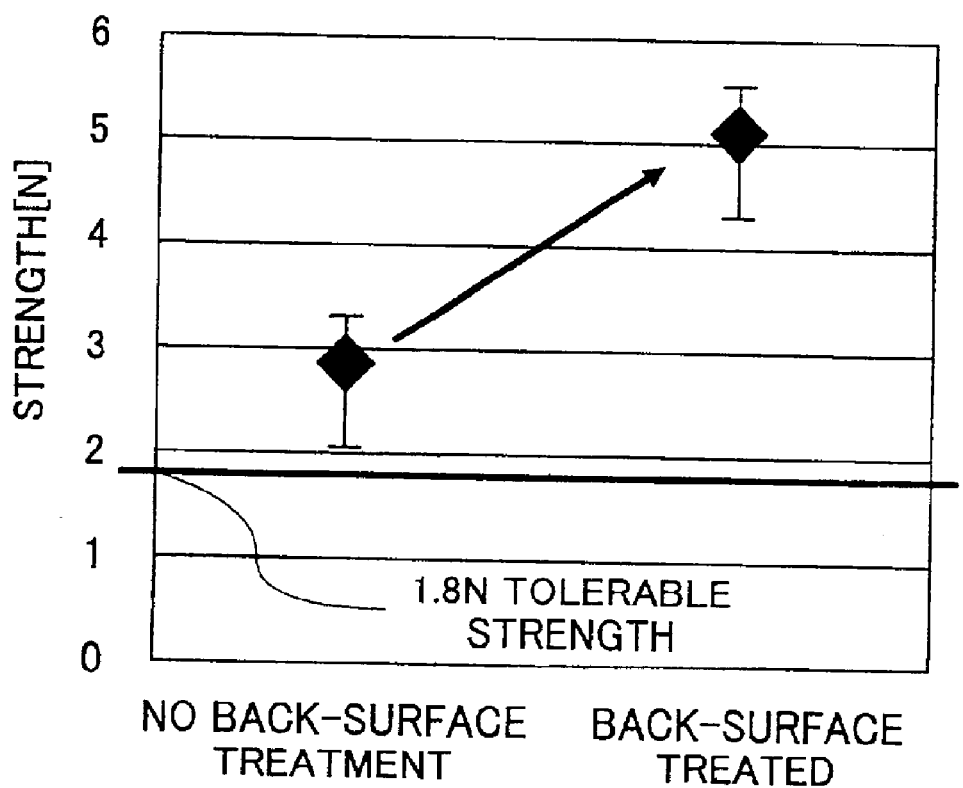
FIG. 18 is a chart showing the measured strength of semiconductor devices.

FIG. 18 is a chart showing the measured strength of the semiconductor devices 10 according to this embodiment.

The semiconductor devices 10 are 8 mm×8 mm, with the back-grinding marks 12 formed to a depth of 100 μm. The laser generation apparatus 33 emits a laser beam having a wavelength of 532 nm and a pulse length of 200 μs. The laser exposure apparatus 30A processes the back surface of the semiconductor devices 10 by use the laser spot 31a having a spot diameter of 100 μm and the galvano scan method employing a scan pitch of 50 μm.

As was previously described, the semiconductor devices 10X and 10Y with the unremoved back-grinding marks 12 have the tolerable strength of 1.8 N at the time of chip pickup, whereas the measured strength is 2.8 N on average with a minimum of 2 N that leaves a little margin to spare. When the laser beam 31 is shone on the back surface of the wafer 1 in this embodiment, the measured strength improves to an average of 5 N, with a maximum of 5.6 N and a minimum of 4.3 N.

As is apparent from these figures, the structural strength with a sufficient margin is achieved when the semiconductor devices 10 are taken off from the dicing tape 6 by use of the pushing pins 11 at the mounting step. The semiconductor devices 10 that have not been treated with the laser beam 31 would no allow themselves to be taken off if the thickness thereof is less than 100 μm. After illumination by the laser beam 31, however, they can be taken off even if the thickness is 80 μm.

In the following, a method of manufacturing semiconductor devices according to a fourth embodiment of the present invention will be described.

In the description that follows regarding the method of manufacturing semiconductor devices according to this embodiment, a description will be omitted with respect to the same structures and steps as those of the third embodiment described with reference to FIGS. 15A–15F through FIG. 18.

Figure 22:
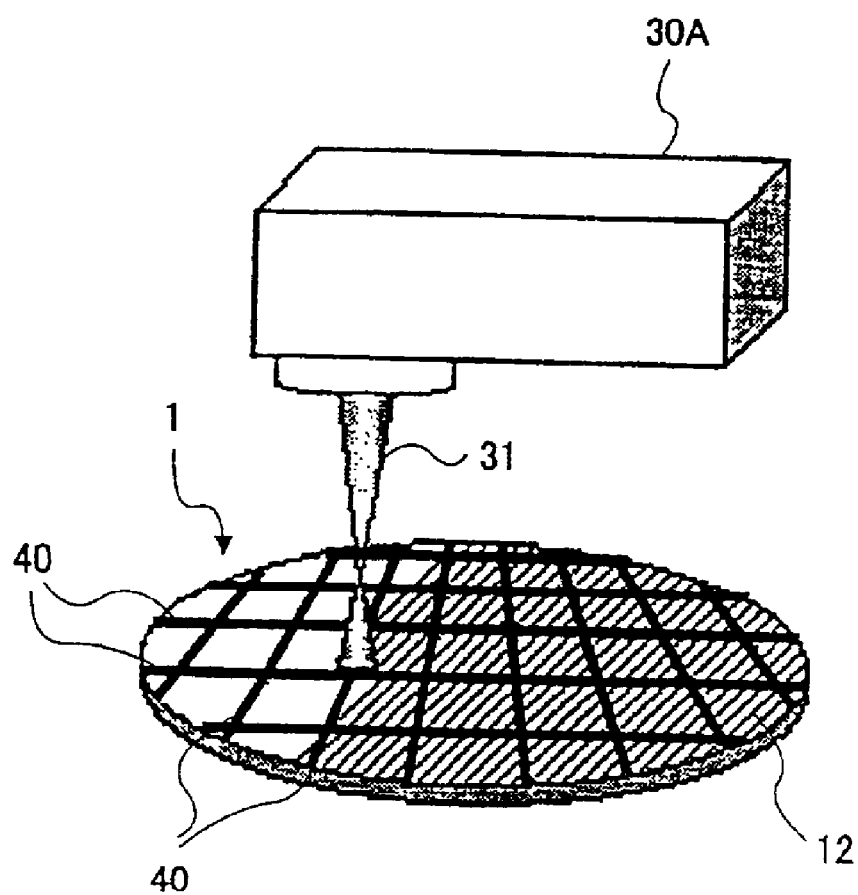
FIG. 22 is an illustrative drawing showing the way a laser beam is shone on the back surface of a wafer separately for each wafer.

In the fourth embodiment, a laser exposure step is performed after the dicing step. As shown in FIG. 22, the laser beam 31 is shone on the back surface of the wafer 1 separately for each wafer after the wafer 1 is diced along dicing lines 40.

Figure 23A:
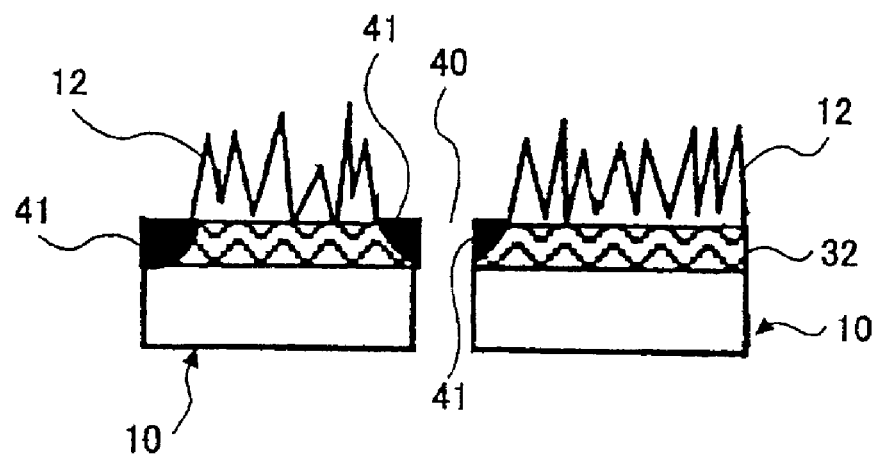
FIG. 23A is an illustrative drawing showing a profile of the back surface of a wafer before a laser exposure step.
Figure 23B:
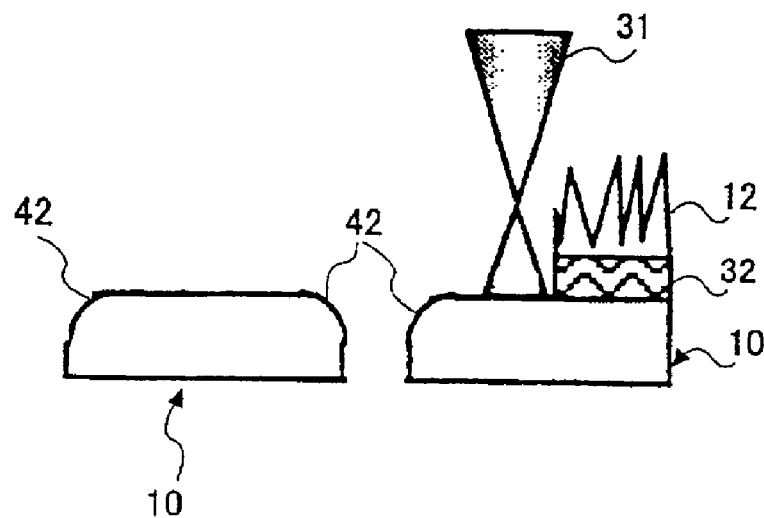
FIG. 23B is an illustrative drawing showing a profile of the back surface of the wafer after the laser exposure step.

FIG. 23A is an illustrative drawing showing a profile of the back surface of the wafer 1 before the laser exposure step. FIG. 23B is an illustrative drawing showing a profile of the back surface of the wafer 1 after the laser exposure step.

In this embodiment, the laser exposure step is performed after the back-grind step and the dicing step. Before this laser exposure step, the back surface of the wafer 1 has the back-grinding marks 12 and the cracked layer 32 formed thereon, as shown in FIG. 23A. Along the dicing lines, also, chipping 41 is present. The back-grinding marks 12, the cracked layer 32, and the chipping 41 may cause a further chip crack or breakage when a stress such as a bending force is applied.

Illumination by the laser beam 31 at the laser exposure step removes the back-grinding marks 12 and the cracked layer 32 as shown in FIG. 23B. Since the portion that has the chipping 41 is structurally fragile, chips will be taken off, and the edges of the semiconductor devices 10 will be properly processed, thereby leaving rounded portions 42 (which has a profile of a smoothly curved line).

After the laser exposure step, therefore, the back surfaces of the semiconductor devices 10 are smooth without the back-grinding marks 12 or the cracked layer 32. The edge portions are provided with the rounded portions 42. This improves the structural strength of the semiconductor devices 10, and reliably prevents chip cracks and breakages even when an external force is applied, e.g., even when they are pushed up by the pushing pins 11.

In the following, a method of manufacturing semiconductor devices according to a fifth embodiment of the present invention will be described.

In the description that follows regarding the method of manufacturing semiconductor devices according to this embodiment, a description will be omitted with respect to the same structures and steps as those of the third embodiment described with reference to FIGS. 15A–15F through FIG. 18.

In the fifth embodiment, a laser exposure step is performed while the semiconductor devices 10 are carried piece by piece to the board 9 from where they were diced. Namely, the laser exposure step is inserted into the middle of the mounting step.

Figure 24C:
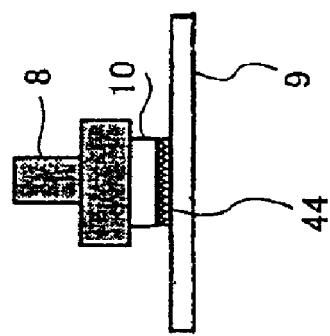
FIGS. 24A through 24C are illustrative drawings showing a laser exposure step of a fifth embodiment.
Figure 24B:
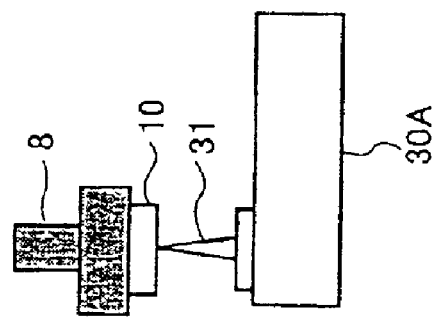
Figure 24A:
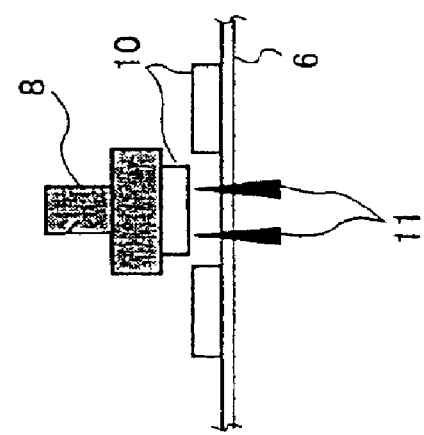

As was previously described, at the mounting step, pieces of the semiconductor devices 10 are taken off from the dicing tape 6 by pushing them up by the pushing pins 11, and are picked up by the collet 8 one after another as shown in FIG. 24A. In the previous embodiments, the collet 8 carries the semiconductor devices 10 to the board 9 immediately after it picks up the semiconductor devices 10. In this embodiment, however, the laser exposure apparatus 30A is situated halfway to the board 9. In the middle of the path through which the semiconductor devices 10 are carried to the board 9, the laser beam 31 is shone on the back surface of the semiconductor devices 10 as shown in FIG. 24B.

In the fourth embodiment previously described, illumination by the laser beam 31 was performed on the wafer 1 on a wafer-by-wafer basis after the dicing step. In the fifth embodiment, illumination by the laser beam 31 is performed on each piece of the semiconductor devices on a piece-by-piece basis after the dicing step.

Since illumination by the laser beam 31 is performed after the dicing step as in the fifth embodiment, the fourth embodiment can remove the back-grinding marks 12, the cracked layer 32, and the chipping 41, further creating the rounded portions 42 at the edges of the semiconductor devices 10. The back surfaces of the semiconductor devices 10 after the laser exposure step will thus be smooth without the back-grinding marks 12 or the cracked layer 32, and be provided with the rounded portions 42 at the edges thereof.

This improves the structural strength of the semiconductor devices 10, and reliably prevents chip cracks and breakages even when an external force is applied, e.g., even when they are pushed up by the pushing pins 11. Further, dusts that are generated by dicing and attached to the back surface of the semiconductor devices 10 will be removed by the laser beam 31. This insures reliable implementation of the semiconductor devices 10 on the board 9.

In the following, a method of manufacturing semiconductor devices according to a sixth embodiment of the present invention will be described.

In the description that follows regarding the method of manufacturing semiconductor devices according to this embodiment, a description will be omitted with respect to the same structures and steps as those of the third embodiment described with reference to FIGS. 15A–15F through FIG. 18.

Laser illumination for removing the back-grinding marks 12 and the cracked layer 32 may include entire-surface illumination and partial-surface illumination. The entire-surface illumination removes all defects on the back surface of the wafer 1 or the back surfaces of the semiconductor devices 10. Laser illumination based on the scanning of a laser beam, however, consumes time.

Figure 25:
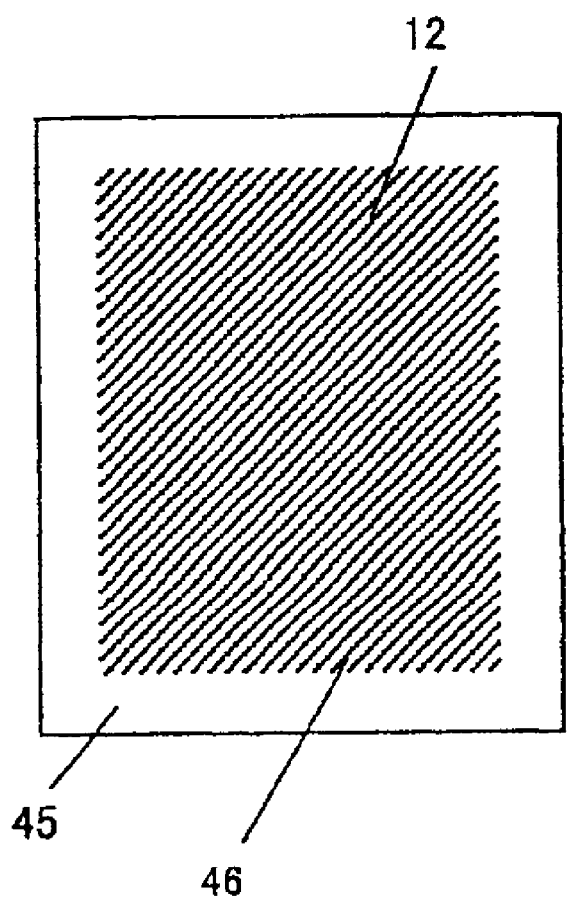
FIG. 25 is an illustrative drawing showing a semiconductor device having a laser-treated portion and a laser-untreated portion according to a sixth embodiment.

In this embodiment, as shown in FIG. 25, grinding marks are removed by shining the laser beam 31 only on the perimeter of a semiconductor device 10C. In detail, the semiconductor device 10C has a laser-treated portion 45 upon which the laser beam 31 is shone and a laser-untreated portion 46 which are not exposed to the laser beam 31. The laser-untreated portion 46 has the back-grinding marks 12 remaining thereon.

When the laser-treated portion 45 is formed only along the perimeter of the semiconductor device 10C as in this embodiment, cracking caused by the back-grinding marks 12 will still be prevented. In the presence of the back-grinding marks 12, cracking occurs at the edges of the semiconductor device 10C. If there are no back-grinding marks 12 on the perimeter edges of the semiconductor device 10C, thus, cracking and breaking can still be prevented properly, although less effectively compared with the case where all the back-grinding marks 12 are removed.

When the laser-treated portion 45 is formed only along the perimeter of the semiconductor device 10C, the size of an illuminated area is smaller compared with the case in which the laser beam 31 is shone all over the surface of the semiconductor device 10C. This reduces the time required for laser illumination.

In the following, a method of manufacturing semiconductor devices according to a seventh embodiment of the present invention will be described.

In the description that follows regarding the method of manufacturing semiconductor devices according to this embodiment, a description will be omitted with respect to the same structures and steps as those of the third embodiment described with reference to FIGS. 15A–15F through FIG. 18.

Figure 26:
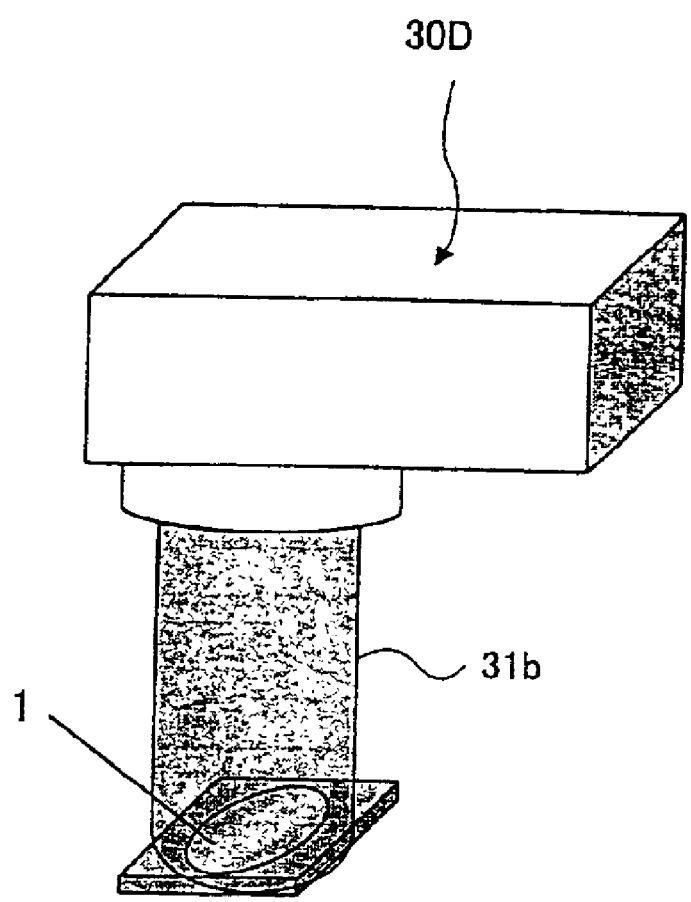
FIG. 26 is an illustrative drawing showing a laser exposure apparatus that emits a laser beam having a beam spot size larger than a wafer according to a seventh embodiment.

In this embodiment, as shown in FIG. 26, a laser exposure apparatus 30D is employed that emits a laser beam 31B having a beam spot size larger than the wafer 1 or the semiconductor devices 10. In this configuration, there is no need to scan a laser beam, thereby contributing to a reduction of processing time. Further, since the back surface of the wafer 1 or the semiconductor devices 10 is treated at once, the finish of the same quality is obtained all over the surface.

Further, the present invention is not limited to these embodiments, but various variations and modifications may be made without departing from the scope of the present invention.

The present application is based on Japanese priority application No. 2001-322812 filed on Oct. 19, 2001, with the Japanese Patent Office, the entire contents of which are hereby incorporated by reference.

What is claimed is:

1. A method of making a semiconductor device, comprising;
   a back-grinding step of grinding a back surface of a semiconductor substrate;
   a grinding-mark generating step of generating grinding marks that extend in a direction different from directions of the predetermined dicing lines after said back-grinding step, said grinding marks being generated by grinding the back surface of the semiconductor substrate by a grinding apparatus that includes a plurality of end-mills; and
   a dicing step of dicing the semiconductor substrate along the predetermined dicing lines so as to create pieces of semiconductor devices after said grinding-mark generating step.

* * * * *